(12) United States Patent
Jewram et al.

(10) Patent No.: US 8,205,766 B2
(45) Date of Patent: Jun. 26, 2012

(54) METHOD FOR PACKAGING THERMAL INTERFACE MATERIALS

(75) Inventors: Radesh Jewram, Lakeville, MN (US); William E. McIntosh, Northfield, MN (US)

(73) Assignee: The Bergquist Company, Chanhassen, MN (US)

( * ) Notice: Subject to any disclaimer, the term of this patent is extended or adjusted under 35 U.S.C. 154(b) by 348 days.

(21) Appl. No.: 12/469,053

(22) Filed: May 20, 2009

(65) Prior Publication Data

US 2010/0294780 A1     Nov. 25, 2010

(51) Int. Cl.
    *B65D 90/12*     (2006.01)
(52) U.S. Cl. .................. 220/600; 206/714; 206/725
(58) Field of Classification Search .......... 206/713, 206/714, 716, 725, 447, 813; 220/600
    See application file for complete search history.

(56) References Cited

U.S. PATENT DOCUMENTS

| | | |
|---|---|---|
| 3,858,721 A | 1/1975 | Boyer |
| 4,188,438 A | 2/1980 | Burns |
| 4,406,367 A | 9/1983 | Bouwknegt |
| 4,494,902 A | 1/1985 | Kuppens |
| 4,575,995 A | 3/1986 | Tabuchi |
| 4,702,370 A | 10/1987 | Honda |
| 4,716,124 A | 12/1987 | Yerman |
| 4,753,061 A | 6/1988 | Braden |
| 4,966,282 A | 10/1990 | Kawanishi |
| 5,076,427 A * | 12/1991 | Thomson et al. ............ 206/714 |
| 5,101,975 A | 4/1992 | Runyon |
| 5,132,160 A | 7/1992 | Bird |
| 5,136,827 A | 8/1992 | Sawaya |
| 5,191,693 A | 3/1993 | Umetsu |
| 5,203,143 A | 4/1993 | Gutentag |
| 5,226,226 A * | 7/1993 | Fierkens ............ 29/827 |
| 5,234,104 A * | 8/1993 | Schulte et al. ........... 206/714 |
| 5,234,105 A | 8/1993 | Sato |
| 5,259,911 A | 11/1993 | Ohnishi |
| 5,325,654 A | 7/1994 | Juntunen |
| 5,361,901 A * | 11/1994 | Schenz et al. ............ 206/714 |
| 5,472,085 A | 12/1995 | Gelzer |
| 5,499,717 A * | 3/1996 | Hayashi ............ 206/701 |

(Continued)

FOREIGN PATENT DOCUMENTS

EP          1073325          1/2001

(Continued)

OTHER PUBLICATIONS

Lutzow, S., "Tape-and-reel [packaging]"; Advanced Packaging, vol. 10, No. 8, p. 25-30, (Lutzow date is Aug. 1, 2001 per attached interview summary Mar. 29, 2012).

(Continued)

*Primary Examiner* — J. Gregory Pickett
*Assistant Examiner* — Andrew Perreault
(74) *Attorney, Agent, or Firm* — Haugen Law Firm PLLP

(57) ABSTRACT

A package for delivery of a tacky product includes a carrier tape with a plurality of cavities separately disposed along a length thereof. Each of the cavities in the carrier tape includes a base that is sized to operably receive and support the product. The base of each cavity includes a surface profile which defines a contact surface area that is sufficiently low so as to facilitate removal of the product from the cavity without damage to the product. In some cases, the contact surface area is less than about 50% of a base surface area of the base. The carrier tape may be configured for use in tape and reel packaging systems.

24 Claims, 6 Drawing Sheets

U.S. PATENT DOCUMENTS

| | | | |
|---|---|---|---|
| 5,524,765 A | 6/1996 | Gutentag | |
| 5,526,935 A * | 6/1996 | Tidemann et al. | 206/713 |
| 5,648,136 A | 7/1997 | Bird | |
| 5,673,795 A * | 10/1997 | Clatanoff et al. | 206/719 |
| 5,800,772 A | 9/1998 | Kurasawa | |
| 5,810,170 A | 9/1998 | Alvite | |
| 5,875,897 A | 3/1999 | Duncan | |
| 5,908,114 A | 6/1999 | Althouse et al. | |
| 5,931,337 A | 8/1999 | Ando | |
| 5,960,961 A | 10/1999 | Gutentag | |
| 5,964,353 A * | 10/1999 | Hamlin | 206/714 |
| 6,003,676 A | 12/1999 | Beyer | |
| 6,030,692 A | 2/2000 | Auger | |
| 6,033,933 A | 3/2000 | Hur | |
| 6,076,681 A * | 6/2000 | Chenoweth | 206/714 |
| 6,105,783 A | 8/2000 | Sato | |
| 6,149,010 A | 11/2000 | Tanaka et al. | |
| 6,173,750 B1 | 1/2001 | Davis et al. | |
| 6,176,373 B1 | 1/2001 | Kato | |
| 6,182,828 B1 | 2/2001 | Hiruta | |
| 6,206,198 B1 | 3/2001 | Troxtell | |
| 6,216,419 B1 | 4/2001 | Sakurai | |
| 6,250,051 B1 | 6/2001 | Mori | |
| 6,297,075 B1 | 10/2001 | Odajima | |
| 6,332,268 B1 | 12/2001 | Imanishi | |
| 6,425,484 B1 | 7/2002 | Sakurai | |
| 6,451,623 B1 | 9/2002 | Kawada | |
| 6,469,372 B2 | 10/2002 | Hayden | |
| 6,568,535 B1 | 5/2003 | Pylant | |
| 6,657,297 B1 | 12/2003 | Jewram et al. | |
| 6,694,707 B2 | 2/2004 | Lehner | |
| 6,708,816 B2 | 3/2004 | Schindler | |
| 6,740,966 B2 | 5/2004 | Nakamura | |
| 6,820,401 B2 | 11/2004 | Behnke | |
| 6,860,391 B2 * | 3/2005 | Kawada | 206/701 |
| 7,005,749 B2 | 2/2006 | Hsu | |
| 7,071,026 B2 | 7/2006 | Fujimoto | |
| 7,096,648 B2 | 8/2006 | Kawada | |
| 7,096,914 B2 | 8/2006 | Kim | |
| 7,097,040 B1 | 8/2006 | Gutentag | |
| 7,154,166 B2 | 12/2006 | Ano | |
| 7,169,643 B1 | 1/2007 | Hashimoto | |
| 7,288,438 B2 | 10/2007 | Lu | |
| 7,318,307 B2 | 1/2008 | Hoegerl | |
| 7,389,877 B2 | 6/2008 | Dick | |
| 7,399,657 B2 * | 7/2008 | Bolken et al. | 438/106 |
| 2001/0039076 A1 | 11/2001 | Hashimoto | |
| 2003/0129343 A1 | 7/2003 | Galkiewicz et al. | |
| 2004/0188814 A1 | 9/2004 | Houle | |
| 2005/0073037 A1 | 4/2005 | Wright | |
| 2005/0151555 A1 | 7/2005 | Lewis | |
| 2005/0176171 A1 | 8/2005 | Miyaki | |
| 2006/0138019 A1 * | 6/2006 | Yoshii et al. | 206/714 |
| 2006/0157381 A1 | 7/2006 | Adams | |
| 2006/0157382 A1 * | 7/2006 | Yasufuku et al. | 206/714 |
| 2006/0228542 A1 | 10/2006 | Cuzbarow | |
| 2007/0023931 A1 | 2/2007 | Chew et al. | |
| 2007/0210082 A1 * | 9/2007 | English et al. | 220/4.21 |
| 2007/0216000 A1 | 9/2007 | Sasamura | |
| 2007/0284144 A1 | 12/2007 | Too | |
| 2007/0284737 A1 | 12/2007 | Too | |
| 2008/0006922 A1 | 1/2008 | Gutentag | |
| 2008/0096318 A1 | 4/2008 | Hariu | |
| 2008/0124840 A1 | 5/2008 | Su | |

FOREIGN PATENT DOCUMENTS

| | | |
|---|---|---|
| JP | 3025947 | 2/1991 |
| JP | 4016468 | 1/1992 |
| JP | 4031260 | 2/1992 |
| JP | 4069963 | 3/1992 |
| JP | 6163617 | 6/1994 |
| JP | 7122682 | 5/1995 |
| JP | 9036135 | 2/1997 |
| JP | 10116842 | 5/1998 |
| JP | 10144735 | 5/1998 |
| JP | 10258872 | 9/1998 |
| JP | 11147507 | 6/1999 |
| JP | 2001246666 | 9/2001 |
| JP | 2003197715 | 7/2003 |
| JP | 2003218165 | 7/2003 |
| JP | 2003338526 | 11/2003 |
| JP | 2004327550 | 11/2004 |
| JP | 2005072626 | 3/2005 |
| JP | 2005093958 | 4/2005 |
| JP | 2006306403 | 11/2006 |
| JP | 2007254079 | 10/2007 |
| WO | 0207962 | 1/2002 |
| WO | 0219354 | 3/2002 |
| WO | 04001663 | 12/2003 |

OTHER PUBLICATIONS de Miranda, W.R.R.; Manufacturing Methods and Technology Engineering for Tape Chip Carrier (Quarterly report for period ending Sep. 30, 1977); ECOM-77-0526-1, Nov. 1977, 49p.

* cited by examiner

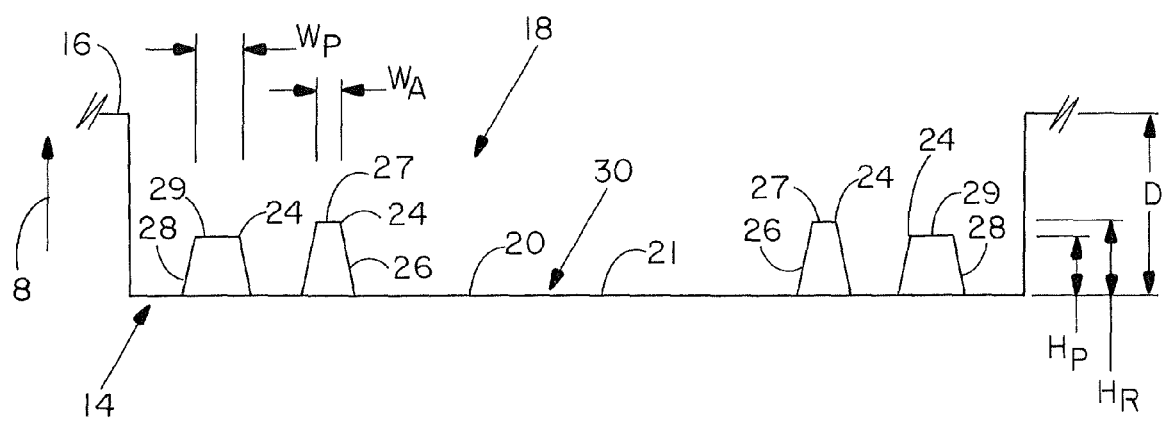
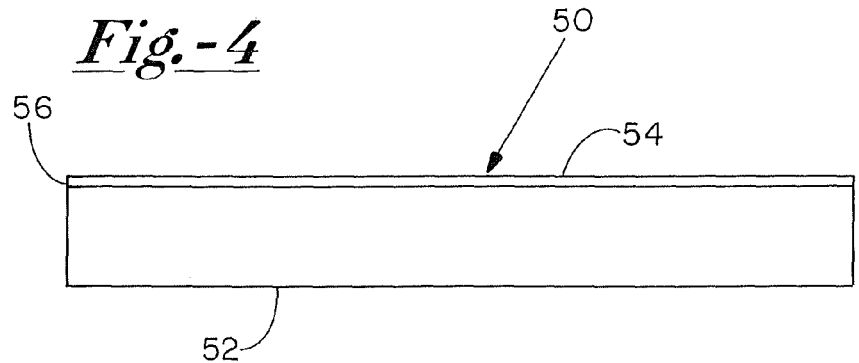

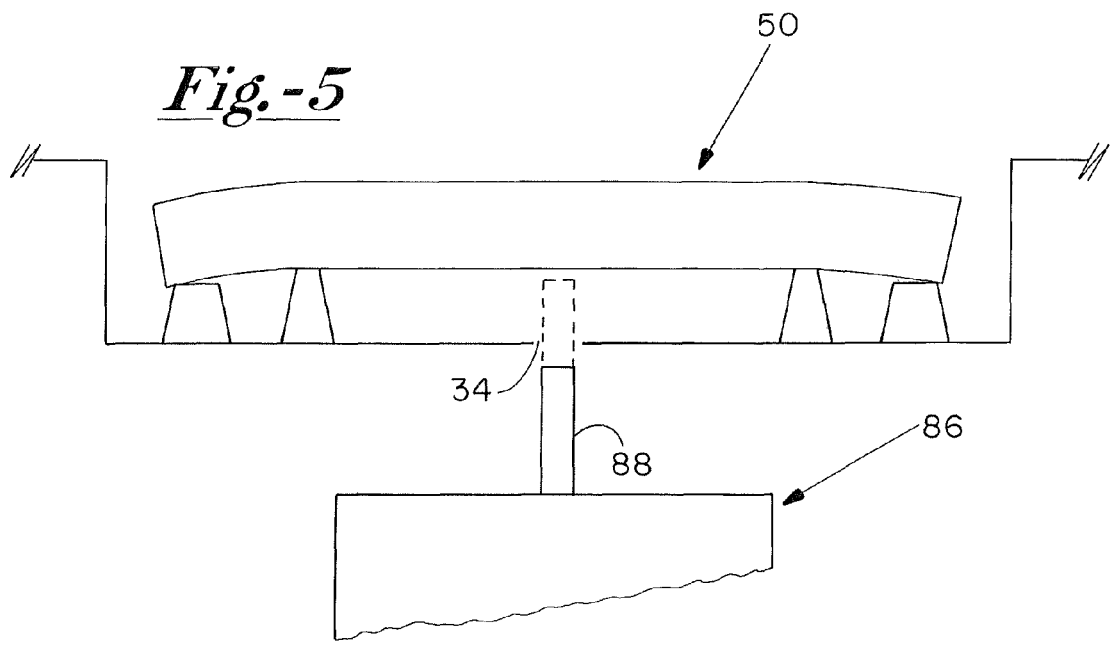
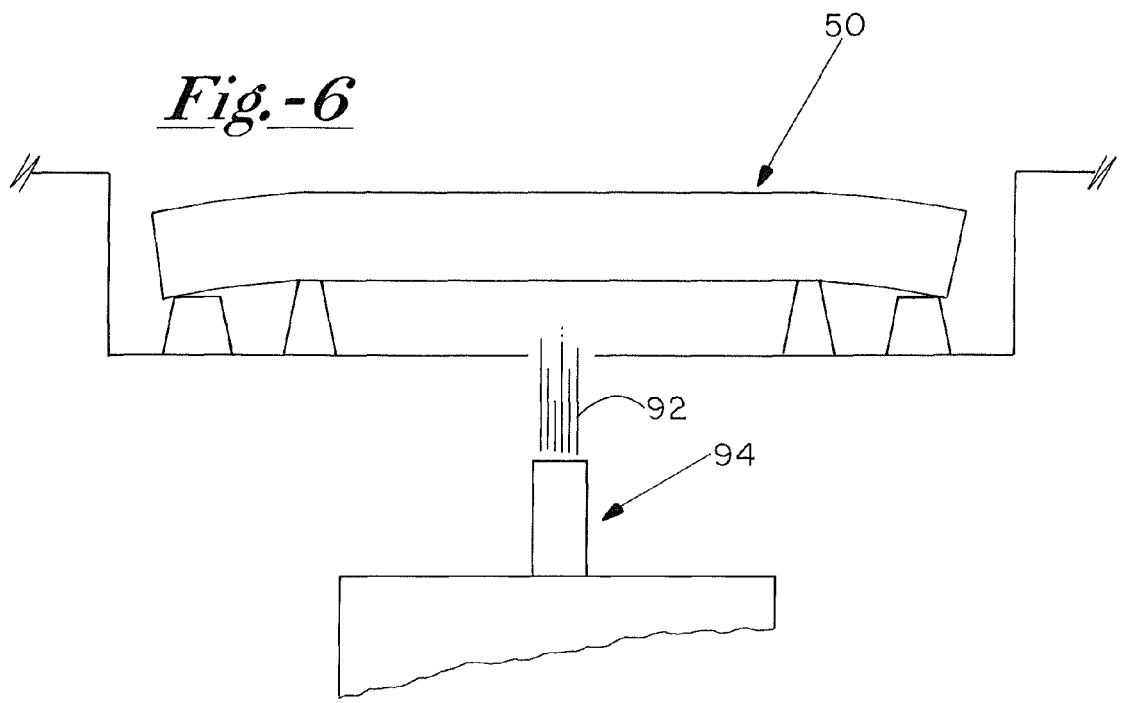

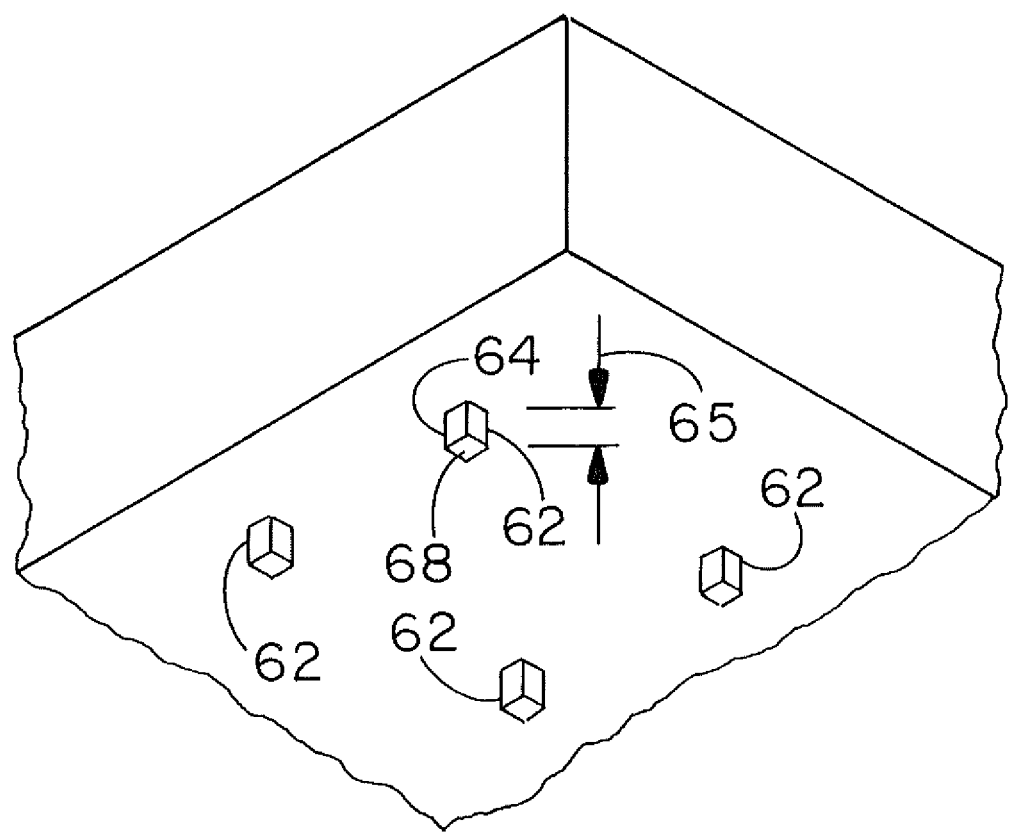

METHOD FOR PACKAGING THERMAL INTERFACE MATERIALS

FIELD OF THE INVENTION

The present invention relates to packaging systems generally, and more particularly to packaging systems which are configured to efficiently package and deliver a tack product, such as a conformable thermal interface material, to installation facilities. In particular, the packaging systems of the present invention enable removal of the tacky product from the package without damage or destruction to the product.

BACKGROUND OF THE INVENTION

Electronic components of the various type require heat transfer systems in order to remove excess heat generated in the operation thereof. Excess heat can reduce performance of the electronic components, and, in some cases, can lead to damage or shut down of the electronic components. A common electronic component in need of heat transfer systems is an integrated circuit, such as a microprocessor, which typically generates significant amounts of excess thermal energy.

One mechanism for transferring excess heat from, for example, integrated circuits, utilizes a thermal interface material (TIM) placed between the integrated circuit and a thermal diffusion structure, which typically has high surface area for efficient heat transfer to a cooling medium such as air. The thermal interface material is typically one that is highly thermally conductive, and is preferably "conformable" so as to conform to the uneven surfaces of the electronic component and the thermal diffusion structure without substantial gaps, which create barriers to heat transfer. The thermal interface material may posses a relatively low bulk modulus value in order to provide the conformability characteristic described above, and to therefore most efficiently transfer thermal energy away from the operating electronic component. Some thermal interface materials are "phase-changing", in that their native viscosities decrease in elevated temperature environments, such as in proximity to an operating electronic component. In most installations, however, thermal interface materials have relatively low modulus values even at room temperature. Typical TIM modulus values at 20° C. may be less than about 50 Shore 00, and may be between about 5-50 Shore 00. This modulus range often results in a relatively "tacky" surface characteristic of the TIM.

Conventional thermal interface materials include various types of pastes, gels, and metals, and may be executed in a variety of formats. An increasingly popular format for thermal interface materials is a "pad" or a defined body with substantially defined surfaces and dimensions. Such thermal interface pads have proven useful and efficient in packaging and installation, and particularly in connection with "pick and place" installation operations.

The attachment of TIMs to electronic devices typically involves a number of process steps. The increasing prevalence of "pick and place" installation systems for thermal interface pads has reduced the number of process steps required in the attachment of thermal interface materials to electronic components. However, pick and place systems are most effective when used in connection with rigid, non-tacky structures, and efforts to implement the installation of relatively low-modulus TIM with pick and place equipment has therefore been challenging. A primary problem encountered in this scenario is the TIM becoming wholly or partially adhered to the pick and place equipment and/or the TIM packaging. Such adherence can damage the TIM, and can also require installation equipment shut down for cleaning.

In some cases, releasable surface liners have been employed in relatively low-modulus thermal interface pads so that the pad may be readily disengaged from the installation equipment. Addition of release liners, however, increases the cost of the thermal interface pads, and requires a further process step to remove the release liner prior to attachment of a thermal diffusion structure to the electronic apparatus. Other efforts have focused on an integrated, relatively high cross-linked integrated surface layer for interfacing with the pick and place installation equipment. Neither of such solutions, however, address the tackiness of the thermal interface pad where the pad is stored in packaging. Consequently, delivery of thermal interface pads to installation facilities through conventional packaging has resulted in unsatisfactory rates of TIM damage due to undesired adherence of the thermal interface pad to the packaging. The tackiness of the relatively low modulus thermal interface pads adheres to conventional packaging systems, and inhibits efficient and damage-free removal of the thermal interface pads therefrom.

Therefore it is an object of the present invention to provide packaging which facilitates delivery and removal of a tacky product, such as a thermal interface pad, by thermal interface installation equipment.

It is another object of the present invention to provide packaging that is compatible with conventional tape and reel packaging systems, which packaging facilitates efficient and non-destructive removal of tacky products from respective receptacles in the packaging.

It is a still further object of the present invention to provide methods for facilitating installation of tacky products, such as thermal interface pads, to heat-generating components.

SUMMARY OF THE INVENTION

By means of the present invention, tacky products such as relatively low modulus thermal interface materials may be packaged and delivered to an installation location, and may be removed from the packaging with a significantly reduced risk of damage. The package of the present invention minimizes the surface area which operably comes into contact with the tacky product. By minimizing such contact surface area, adhesion force between the tacky product and the packaging is significantly reduced, thereby enabling efficient and non-damaging removal of the product from the packaging.

In one embodiment, the package may be adapted for delivery of the tacky product having a base contact modulus of less than about 50 Shore 00, and includes a carrier tape having an upper surface and a plurality of cavities separately disposed in the upper surface along a length thereof. Each of the cavities includes a base that is sized to operably receive and support the product, and has a base surface area and a surface profile defining an elevated contact surface area that is less than about 50% of the base surface area. The surface profile includes a ridge extending at least partially about a central portion of the base, wherein the central portion makes up at least about 1-15% of the base surface area.

In some embodiments, the package of the present invention may be configured for use in tape and reel packaging systems. In addition, the contact surface area may be less than 20% of the base surface area, or may be less than about 10% of the base surface area.

In another embodiment, the package includes a carrier tape having an upper surface and a plurality of cavities separately disposed in the upper surface along a length thereof, wherein each of the cavities includes a base that is sized to operably receive and support the product. The base has a base surface area and a surface profile which defines a delineated first contact surface area that is less than about 50% of the base surface area. The package further includes a cover tape which has a first side that is removably securable to the upper surface of the carrier tape. At least a contact portion of the first side of the cover tape has a surface texture which defines a second contact surface area that is less than about 50% of the contact portion of the cover tape. Such cover tape may be adhesively securable to the upper surface of the carrier tape.

In a still further embodiment, a package system of the present invention includes a product having a base contact modulus of less than about 50 Shore 00, and a carrier tape having an upper surface and a plurality of cavities separately disposed in the upper surface along a length thereof. Each of the cavities includes a base that is sized to operably receive and support the product, and a base surface area and a surface profile defining an elevated first contact surface area that is less than about 50% of the base surface area. The package system described above may further include a cover tape having a first side that is removably securable to the upper surface of the carrier tape. At least a contact portion of the first side has a surface texture defining a second contact surface area that is less than about 50% of the contact portion of the cover tape.

A method for packaging a product having a base contact portion with a modulus of less than about 50 Shore 00 includes providing a carrier tape having an upper surface and plurality of cavities separately disposed in the upper surface along a length thereof. Each of the cavities includes a base that is sized to operably receive and support the product. The base has a base surface area and a surface profile which defines an elevated first surface contact area that is less than about 50% of the base surface area. The method further includes positioning the product in a respective one of said cavities such that the base contact portion of the product is in contact only with the contact surface area of the base. A cover tape is then secured to the upper surface the carrier tape, wherein the cover tape includes a first side that is removably securable to the upper surface of the carrier tape. At least a contact portion of the first side of the cover tape has a surface texture defining a second contact surface area that is less than about 50% of the contact portion of the cover tape.

BRIEF DESCRIPTION OF THE DRAWINGS

FIG. 3 is a cross-sectional side view of the portion of the package illustrated in FIG. 2;

FIG. 4 is a schematic view of a product useful in connection with the package of the present invention;

FIG. 5 is a schematic diagram of a package of the present invention undergoing a product removal process;

FIG. 6 is a schematic diagram of a package of the present invention undergoing a product removal process;

FIG. 8B is an enlarged view of the isolation view illustrated in FIG. 8A; and

DETAILED DESCRIPTION OF THE PREFERRED EMBODIMENTS

The objects and advantages enumerated above together with other objects, features, and advances represented by the present invention will now be presented in terms of detailed embodiments described with reference to the attached drawing figures which are intended to be representative of various possible embodiments of the invention. Other embodiments and aspects of the invention are recognized as being within the grasp of those having ordinary skill in the art.

Figure 1:
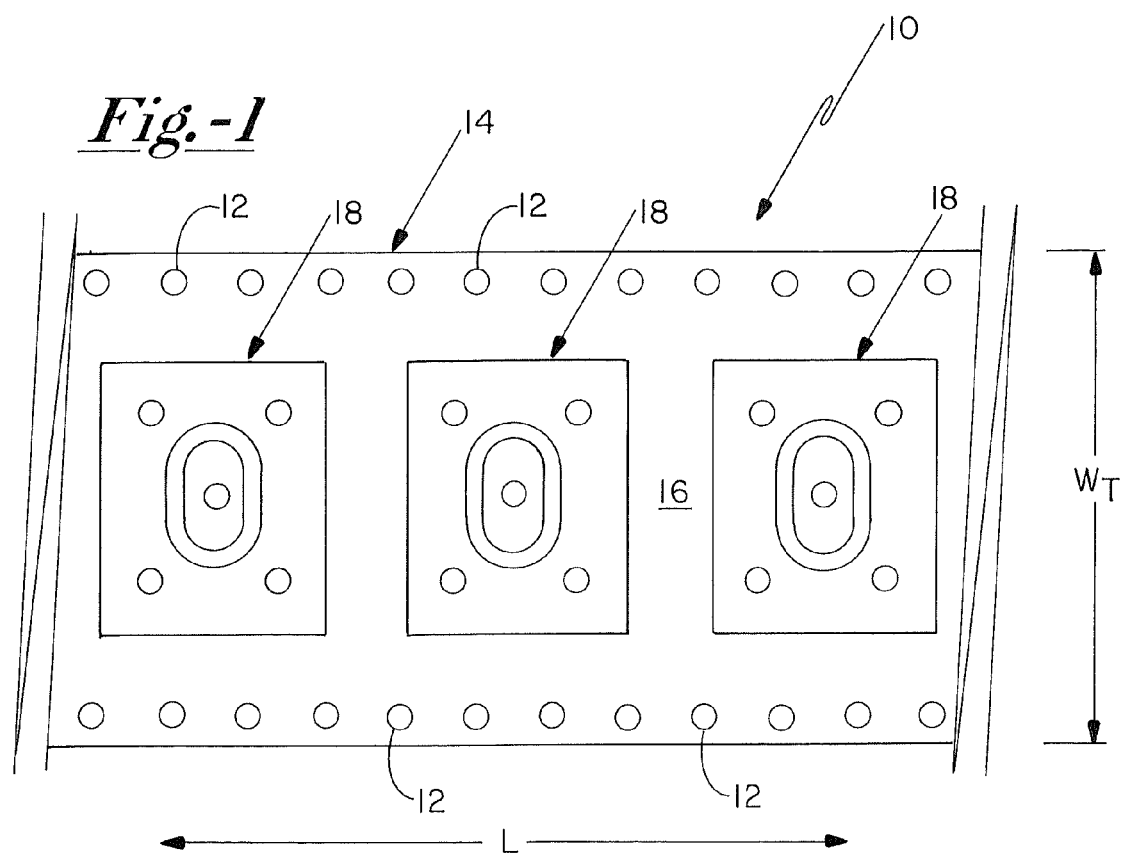
FIG. 1 is a schematic diagram of a portion of a package of the present invention.

With reference now to the drawing figures, and first to FIG. 1, a package 10 of the present invention is adapted for delivery of a tacky product. In some embodiments, package 10 may be configured for use in conventional tape and reel systems, wherein package 10 may be wound upon a reel (not shown), and driven through installation equipment through coordination of sprocket holes 12 with compatible driving cogs of the installation equipment. Package 10, therefore, may be of a standard width, and sprocket holes 12 may be of standard relative spacing, in order to operate in connection with conventional tape and reel packaging systems. It is to be understood that various tape and reel packaging systems may be employed with packaging 10 of the present invention, and that tape and reel packaging systems are well known in the art of packaging and delivery of electronic equipment. In some embodiments, package 10 may comply with the specifications issued by Electronic Industry Association (EIA) standards, including EIA standards 481-1, 481-2, and 481-3.

Package 10 may be manufactured from materials having properties which enable compliance with conventional tape and reel packaging systems. In other embodiments, however, package 10 may not be used in tape and reel packaging systems, and may therefore be sized and configured as desired. Moreover, package 10 need not include sprocket holes 12 for all embodiments, and particularly for non-tape and reel embodiments. Moreover, package 10 may be fabricated from relatively inflexible materials not suited for tape and reel packaging applications.

Figure 2:
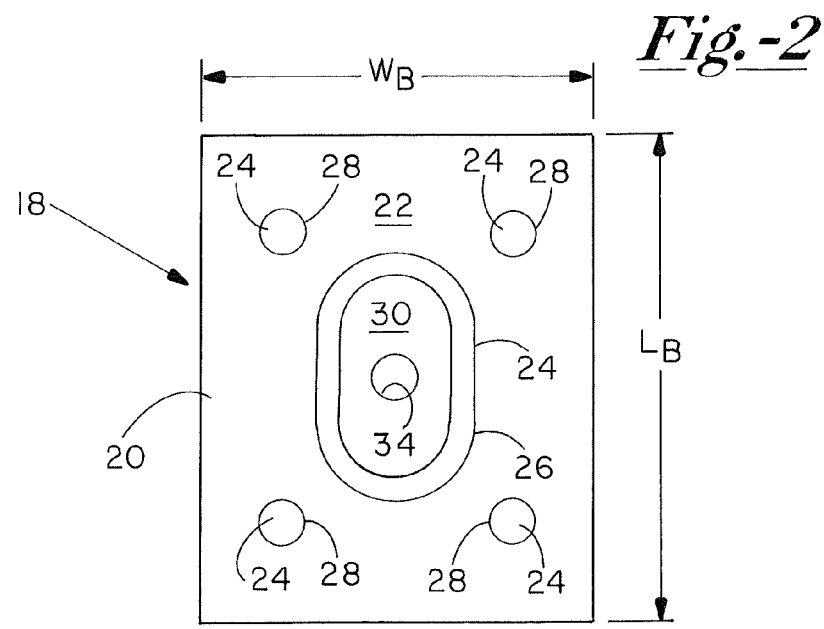
FIG. 2 is an enlarged view of a portion of the schematic package illustrated in FIG. 1.

As illustrated in FIG. 1, package 10 may include a carrier tape 14 having an upper surface 16 and a plurality of cavities 18 separately disposed in upper surface 16 along a length "L" of carrier tape 14. Cavities 18 may be disposed along an entire length "L" of carrier tape 14, or may instead be disposed along only a portion thereof. As shown in FIGS. 1-3, each cavity 18 includes a base 20 that is sized to operably receive and support a tacky product, such as a thermal interface pad 50 illustrated in FIG. 4. In particular, base 20 includes a base surface area 22 that is at least as large as a base contact area 52 of product 50, and that the dimensions of cavity 18 are sufficiently large so as to accommodate product 50 therein.

Base surface area 22 may be defined as the two-dimensional surface area of base 20. In the example embodiment illustrated in FIGS. 1-3, base surface area 22 is the product of base length "$L_B$" and the base width "$W_B$", wherein base 20 is substantially a parallelogram. Configurations for base 20 other than parallelograms, however, are contemplated as being useful in the present invention. In such cases, base surface area 22 may need to be calculated through other appropriate formulas.

Base 20 of cavity 18 includes a surface profile defining a first contact surface area 24 that is delineated from a remainder of base surface area 22. In some embodiments, contact surface area 24 is elevated from the remainder of base surface area 22, such that product 50 comes into contact with contact surface area 24, and not with the remainder of base surface area 22. Accordingly, contact surface area 24 may be defined as a surface area of base 20 against which product 50 comes into contact when operably positioned in cavity 18. In the illustrated embodiment, contact surface area 24 substantially includes the respective upper surfaces of the elevated portions of the surface profile of base 20.

In one embodiment, the surface profile of base 20 includes a ridge 26 extending about a central portion 30 of base 20. Ridge 26 may take on the overall configuration of an oval about central portion 30, though a variety of other configurations for ridge 26 are contemplated by the present invention, and ridge 26 may be configured to not completely enclose central portion 30 of base 20. In one embodiment, a contact surface 27 of ridge 26 may be elevated by a dimension "$H_R$" appropriate to support product 50 above a major surface 21 of base 20. In some embodiments, dimension "$H_R$" may be between about 1-5 mm, and is configured to enable product 50 to be operably positioned in cavity 18 with an upper surface 52 of product 50 remaining below upper surface 16 of carrier tape 14. The overall configuration for ridge 26 may be designed to provide adequate support to product 50, so that base contact portion 52 remains suspended above major surface 21 of base 20, while minimizing the total contact surface area 24 required to so support product 50.

In some embodiments, the surface profile of base 20 may further include one or more pedestals 28 having respective upper surfaces 29 forming a portion of contact surface area 24. Pedestals 28 may be provided at various locations of base 20 for further supporting product 50 operably positioned in cavity 18. Upper surfaces 29 of respective pedestals 28 may be elevated similarly to contact surface 27 of ridge 26. In other embodiments, however, upper surface 29 of pedestals 28 may be elevated to a greater or lesser extent than contact surface 27 of ridge 26. In the illustrated embodiment, one or more upper surfaces 29 of pedestals 28 may be elevated by a dimension $H_P$ that is slightly less than dimension "$H_R$" of ridge 26. For example, one or more upper surfaces 29 of pedestals 28 may be between 0.1 and 1 mm less elevated than contact surfaces 27 of ridge 26. Such a relationship ensures primary contact between product 50 and contact surface area 24 take place at ridge 26, so that operable contact between product 50 and upper surfaces 29 of pedestals 28 occurs only in the event that the contact surface area provided by ridge 26, alone, is insufficient to fully support product 50 above major surface 21 of base 20. In other embodiments, however, such a differential elevation between ridge 26 and pedestals 28 may be provided generally to facilitate removal of product 50 from cavity 18. In still further embodiments, upper surfaces 29 of pedestals 28 are equally elevated with respect to contact surface 27 of ridge 26.

The surface profile arrangement of base 20 may take on a variety of configurations, sizes, and elevations, as desired per application. Moreover, the surface profile of base 20 may take on a variety of forms other than ridge 26 and pedestals 28, with the overarching goal of the surface profile of base 20 being to provide a minimum contact surface area 24 that is nonetheless sufficient and appropriate for facilitating storage of product 50 at cavity 18, as well as for facilitating removal of product 50 from cavity 18. Thus, contact surface area 24 is preferably of appropriate magnitude to adequately support product 50 in storage and transit without damage to product 50, and to also facilitate removal of a potentially tacky product 50 from cavity 18 without damage thereto.

In one embodiment, contact surface area 24 is less than about 50% of base surface area 22. In another embodiment, contact surface area 24 is between about 20% and about 50% of base surface area 22. In a still further embodiment, contact surface area 24 is less than about 20% of base surface area 22. In a yet further embodiment, contact surface area 24 is less than about 10% of base surface area 22. In a still further embodiment, contact surface area 24 is between about 2% and about 10% of base surface area 22.

With reference back to FIGS. 1-2, an aperture 34 may be disposed in base 20. In some embodiments, aperture 34 may be positioned at central portion 30 of base 20. It is contemplated by the present invention that zero or more apertures 34 may be provided in base 20 of carrier tape 14. Aperture 34 may be sized and positioned to allow access to cavity 18 from below carrier tape 14 through base 20. In particular, applicants have determined that it may be advantageous to apply an upward force to base contact portion 52 of product 50 in the removal of product 50 from cavity 18. A variety of mechanisms may be employed to generate such an upward force along vector 8 to base contact portion 52 of product 50 when product 50 is operably disposed in cavity 18. For example, a retractable pin mechanism 86 may retractably extend a pin 88 upward through aperture 34 into contact with product 50 to assist in urging product 50 out from contact with base 20 of cavity 18. In other embodiments, such force may be applied through a moving air stream 92 directed from an outlet 94 along the direction of vector 8 through aperture 34. Such example mechanisms are illustrated in FIGS. 5 and 6. Aperture 34 may therefore be sized to accommodate such force-generating features. In one embodiment, aperture 34 may be between about 1-2 mm in diameter.

As described herein above, package 10 may be adapted for storing and delivering a plurality of products 50, which may be "tacky". In some embodiments, the tackiness of products 50 may be the result of a relatively low modulus value, such as a bulk modulus of less than about 70 Shore 00. Such low modulus values result in a relatively soft material, which can therefore adhere to surfaces against which product 50 may come into contact. Example relatively low modulus products which may be used in connection with package 10 of the present invention include thermal interface materials, such as conformable thermal interface pads. A particular product 50 contemplated by the present invention is a thermal interface pad sold under the tradename "Gap Pad" by the Bergquist Company of Chanhassen, Minn. Such a product has a bulk modulus value of about 20-50 Shore 00.

Other products 50 may also be used in connection with package 10, and may have modulus values of between 5-70 Shore 00, and in some cases even less.

In some embodiments, product 50 may include a top contact layer 56 having a modulus of greater than about 50 Shore 00. Top contact layer 56 may be integrally formed with the remainder of product 50, or may instead by separately applied thereto. Contact layer 56 may be a highly cross-linked version of the material of the remainder of product 50, with an example product 50 with a top contact layer 56 being described in U.S. Pat. No. 6,657,297, assigned to the applicant, the content of which being incorporated herein by reference. The relatively high modulus of top contact layer 56 of product 50 facilitates compatibility with pick and place equipment, wherein product 50 may be easily engaged to, and disengaged from, vacuum heads of such pick and place equipment. In some embodiments, the lack of a top contact layer 56 may result in inadequate disengagement of product 50 from the pick and place equipment and/or damage to product 50 during installation process. The relatively high modulus of top contact layer 56 reduces the "tackiness" of product 50 for the portion of product 50 interfacing with the pick and place equipment.

While product 50 is illustrated in FIG. 4 with a top contact layer 56 having a relatively higher modulus value, it is to be understood that various other products 50 may be utilized in connection with the present invention. For example, release liners or the like may be used in connection with product 50 to assist in rendering efficient the pick and place process of relatively low modulus products. As is understood by those of ordinary skill in the art, products 50 having a top contact layer 56 may be oriented in cavity 18 with top contact layer 56 oriented toward upper surface 16 of carrier tape 14.

Figure 7:
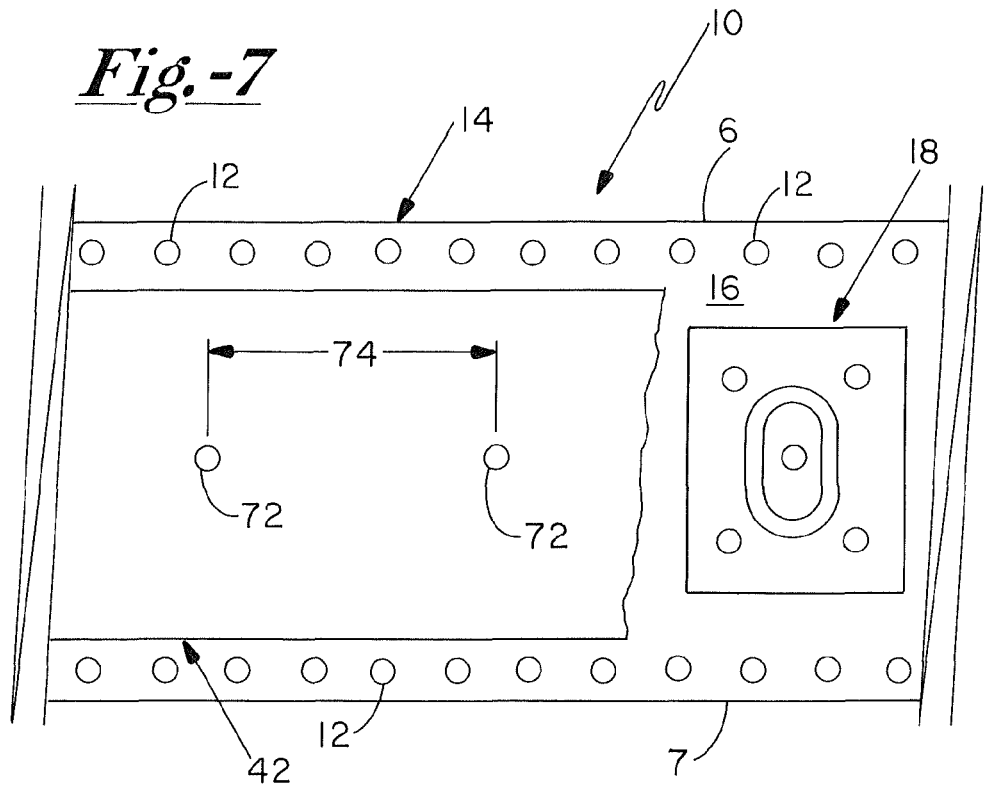
FIG. 7 is a schematic view of a package of the present invention.

In some embodiments of the present invention, package 10 may include a cover tape 42 that is removably securable to upper surface 16 of carrier tape 14. Cover tape 42 may be utilized to enclose product 50 in respective cavities 18 of carrier tape 14. In the embodiment illustrated in FIG. 7, cover tape 42 has a width that is narrower than the width of carrier tape 14 so as to not intrude upon or cover sprocket holes 12, thus leaving available sprocket holes 12 for engagement with a tape and reel packaging systems. In non-tape and reel systems, however, cover tape 42 may have any desired width, including widths equal to and greater than the width of carrier tape 14. It is also to be understood that sprocket holes 12 may be provided on only one side of carrier tape 14, such that cover tape 42 may extend to and/or beyond a respective side edge 6, 7 of carrier tape 14, so long as cover tape 42 does not frustrate the functionality of carrier tape 14.

Figure 8A:
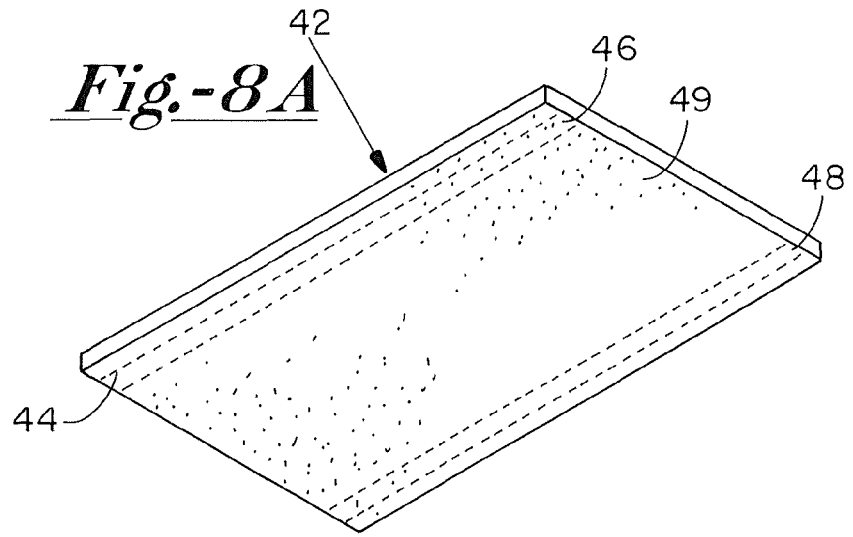
FIG. 8A is an isolation view of a portion of the package illustrated in FIG. 7.

As illustrated in FIG. 8A, cover tape 42 includes a first side 44 that may be particularly adapted for removable securement to carrier tape 14. For example, first side 44 of cover tape 42 may include an adhesive, such as a pressure sensitive adhesive, disposed along mounting portions 46, 48 thereof. In other embodiments, however, cover tape 42 may be removably secured to carrier tape 14 through other securement mechanisms, such as ultrasonic welding, and the like. Adhesives may be located, in some embodiments, only at mounting portions 46, 48 such that cover tape 42 is not unintentionally secured to product 50 operably disposed in cavity 18, and instead is only removably secured to upper surface 16 of carrier tape 14.

Contact portion 49 of first side 44 may include a surface texture which defines a second contact surface area 62 that is less than about 50% of the area of contact portion 49. An enlarged view of FIG. 8A is shown in FIG. 8B, wherein the surface texture of contact portion 49 may be seen in greater detail.

The surface texture of contact portion 49 may be achieved by construction of a cover tape consisting of a strip of textured polyolefin film laminated to the center of an adhesive tape. A textured polyolefin film may be created by a cold embossing operation whereby a smooth polyolefin film is passed between a die with an embossed pattern and a flat or mating anvil, in a rotary embossing machine. It may also be achieved through a textured-mold hot casting process as the film is being fabricated. Typical textured embossing patterns include diamond pattern embossments, variously sized (i.e., with various diamond surface densities), with an embossed depth 65 of, for example, 8.5-11.5 mil (0.0085-0.0115 inch). Another common textured pattern is a taffeta pattern, which is a square embossed pattern, with a range of square sizes (i.e., square surface density) and embossing thicknesses available. A common taffeta pattern is 55 squares per square inch with an embossing thickness 65 of 8.5 mils (0.0085 inch). Typically there is a lower surface area side of a textured liner and a higher surface area side of the textured liner, which factors into the construction of a cover tape as described below.

While contact between cover tape 42 and product 50 is not desired, it is understood that such contact may result in the packaging and delivery process of product 50 in package 10. As a result, the surface texture of contact portion 49 described above may be provided to reduce the likelihood that product 50 undesirably adheres to cover tape 42. The surface texture of contact portion 49 reduces the total surface area which may come into contact with product 50, thereby reducing the likelihood of adherence of product 50 to cover tape 42. Second contact surface area 62 may be defined in a similar fashion as first contact surface area 24, in that second contact surface area 62 is the total surface area of first side 44 of cover tape 42 which operably comes into contact with product 50. In one embodiment, second contact surface area 62 may be defined by the sum of individual surface areas of facing surfaces 68 of each respective protrusion 64 making up the surface texture of contact portion 49.

In some embodiments, cover tape 42 may include one or more apertures 72, which may be operably aligned with cavities 18 of carrier tape 14 when cover tape 42 is removably secured to carrier tape 14. Apertures 72 may be so provided to facilitate removal of a product 50 from cover tape 42 in the unlikely event that a product 50 adheres to cover tape 42 when cover tape 42 is removed from carrier tape 14. Apertures 72 enable the direct application of a separation force to upper surface 54 of product 50 through aperture 72. Such separation force may be accomplished, for example, by a pin mechanism, air stream, or the like. Accordingly, apertures 72 have a relative spacing 74 that is consistent with the relative spacing of cavities 18 along length "L" of carrier tape 14.

EXAMPLE

The following example sets forth a particular embodiment of the invention. The dimensions, materials, and arrangements described in the following example, however, are exemplary only, and illustrate only one set of a variety of dimensions, materials, and arrangements contemplated by the present invention.

A carrier tape having a width dimension "$W_T$" of about 24 mm was prepared from a polystyrene through a known molding process, such as a thermoforming molding process. A set of sprocket holes were punched through the carrier tape along its length and proximate to a first edge thereof. Sprocket hole spacing was set at 4 mm on center, according to an EIA standard for tape and reel package systems. A series of cavities having a spacing of 16 mm on center was provided, with each cavity having a base width dimension "$W_B$" of 11.7 mm, and a base length dimension "$L_B$" of 14.9 mm, wherein each base of each cavity assumed a substantially rectangular shape.

Figure 9:
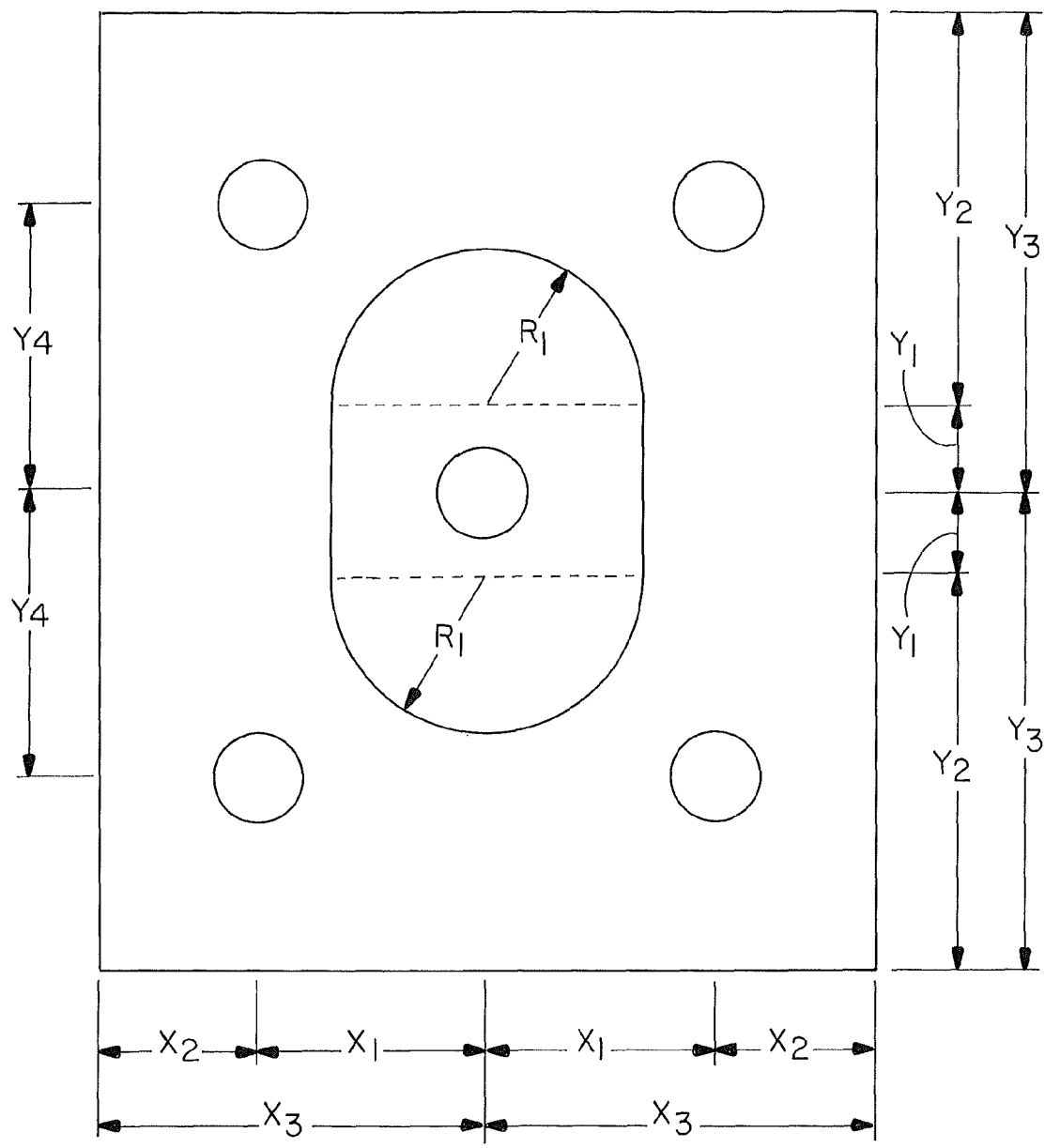
FIG. 9 is a schematic diagram of a portion of a package of the present invention.

Base 20 was recessed from upper surface 16 by a cavity depth "D" of 3.6 mm, and the thickness of carrier tape 14 was about 0.3 mm. Each base was provided with a surface profile having a ridge 26 with a contact surface 27 being elevated by a height dimension "$H_R$" of 2.3 mm, and a width dimension "$W_R$" of 0.4 mm at contact surface 27. The surface profile further included four pedestals 28, as illustrated in FIG. 2, with the pedestal height dimension "$H_P$" being 2.0 mm, and the width dimension "$W_P$" of the respective upper surfaces 29 being 1.0 mm. The surface profile arrangement is illustrated in the diagram of FIG. 9, with the following dimensions:

$X_1$=3.2 mm
$X_2$=2.6 mm
$X_3$=5.85 mm $Y_1$=1.5 mm
$Y_2$=5.95 mm
$Y_3$=7.45 mm
$Y_4$=4.4 mm
$R_1$=2.2 mm

In addition to the above, aperture 34 has a diameter of 1.5 mm and is located at the center of base 22. The dimension "$R_1$" measures to the "outer surface" of ridge 26 with respect to the origin of aperture 34.

The base surface area of each cavity is therefore about 174 mm². The contact surface area is the sum of the ridge contact surface area and the pedestal upper surface areas. In this case, the contact surface area is about 10.5 mm². Thus, the contact surface area is about 6% of the base surface area.

A gap pad "GP5000" from The Bergquist Company of Chanhassen, Minn. was die cut to a dimension of about 12 mm×10 mm (+/−0.5 mm), and was placed in the cavity of the carrier tape.

A cover tape was fabricated by laminating a strip of textured polyolefin film to the adhesive side of an adhesive tape, with the textured surface oriented to contact components in pockets. The strip of laminated film is narrower than the adhesive tape, and is laminated to the center of the adhesive tape, in order to leave a strip of exposed adhesive on either side of the constructed cover tape. The exposed strips of adhesive on either side of the cover tape ensure adherence of the two-piece cover tape to the carrier tape. The textured strip of film is wider than carrier tape pockets, ensuring that components inside the pocket can only come in contact with the textured film. One cover tape construction, for 24 mm wide carrier tape, consists of a clear precision adhesive tape 20 mm wide with a textured film strip (diamond or taffeta pattern as above) measuring 17 mm wide laminated to the center of the clear tape. This results in a cover tape with 85% textured liner coverage, and 15% exposed adhesive tape, per unit length. The exposed edges of adhesive, equal to 1.5 mm width on each side of cover tape, provides adherence of the cover tape to the top surface of the carrier tape. Typically, the adhesive tape used has a precise adhesion (peel) force specification (in addition to precision thickness and width ranges). This allows precise adjustment of exposed adhesive width by adjusting textured liner width, which allows precise adjustment of peel force of cover tape from carrier tape "seen" by the end user. This allows cover tape peel force to be adjusted to a designated target range within the whole peel force range as specified in the EIA-481 industry specification (10-130 grams for 24 mm carrier tape).

A cover tape was removably secured to the upper surface of the carrier tape for storage and delivery of the thermal interface pad product.

The invention has been described herein in considerable detail in order to comply with the patent statutes, and to provide those skilled in the art with the information needed to apply the novel principles and to construct and use embodiments of the invention as required. However, it is to be understood that various modifications to the described embodiments may be accomplished without departing from the scope of the invention itself.

What is claimed is:

1. A package for delivery of a tacky product having a base contact modulus of less than about 70 Shore 00, said package comprising:
a carrier tape having an upper surface and a plurality of cavities separately disposed in said upper surface along a length thereof, each of said cavities including a base defined by a base length and a base width, and that is sized to operably receive and support said product, said base having a base surface area defined as the product of said base length and said base width, and a surface profile defining an elevated contact surface area that is less than about 50% of said base surface area, said surface profile including a ridge substantially surrounding an area defining a central portion of said base, said central portion includes a center of said base, and assumes about 5%-20% of said base surface area, and said ridge comprises between 1 and 15% of said contact surface area.

2. A package as in claim 1 wherein said carrier tape is configured for use in tape and reel packaging systems.

3. A package as in claim 1 wherein said contact surface area is less than about 20% of said base surface area.

4. A package as in claim 1 wherein said contact surface area is less than about 10% of said base surface area.

5. A package as in claim 1, including an aperture in said base.

6. A package as in claim 5 wherein said aperture is disposed at said central portion.

7. A package as in claim 1 wherein said contact surface area is elevated from a remainder of said base surface area by about 2 mm.

8. A package for delivery of a tacky product having a base contact modulus of less than about 50 Shore 00, said package comprising:
(a) a carrier tape having an upper surface and a plurality of cavities separately disposed in said upper surface along a length thereof, each of said cavities including a base that is sized to operably receive and support said product, said base having a base surface area and a surface profile defining a delineated first contact surface area that is less than about 50% of said base surface area; and
(b) a cover tape having a first side removably securable to said upper surface of said carrier tape, said first side having a contact portion contactable with said product and having a surface texture including embossments defining a delineated second contact surface area that is less than about 50% of said contact portion of said cover tape.

9. A package as in claim 8 wherein said carrier tape and said cover tape are configured for use in tape and reel packaging systems.

10. A package as in claim 8 wherein said first contact surface area is less than about 20% of said base surface area.

11. A package as in claim 8 wherein said first contact surface area is elevated from a remainder of said base surface area.

12. A package as in claim 8 wherein said cover tape operably encloses said tacky product within respective ones of said cavities.

13. A package as in claim 8 wherein said cover tape is adhesively securable to said upper surface of said carrier tape.

14. A package system, comprising:
(a) a carrier tape having an upper surface and a plurality of cavities separately disposed in said upper surface along a length thereof, each of said cavities including a base having a base surface area and a surface profile defining an elevated first contact surface area that is less than about 50% of said base surface area; and
(b) a product having a base contact portion with a modulus of less than about 50 Shore 00, said product being disposed in a respective cavity such that said base contact portion is in contact only with said elevated first contact surface area.

15. A package system as in claim 14, including a cover tape having a first side removably securable to said upper surface of said carrier tape, said first side having a contact portion contactable with said product and having a surface texture including embossments defining a delineated second contact surface area that is less than about 50% of said contact portion of said cover tape.

16. A package system as in claim 15 wherein said carrier tape and said cover tape are configured for use in tape and reel packaging systems.

17. A package system as in claim 14 wherein said first contact surface area is less than about 20% of said base surface area.

18. A package system as in claim 15 wherein said product is a thermal interface material.

19. A package system as in claim 18 wherein said product includes a top contact layer having a modulus of greater than about 50 Shore 00, wherein said product is oriented in said respective cavity with said top contact layer positioned in proximity to said cover tape.

20. A method for packaging a product having a base contact portion with a modulus of less than about 50 Shore 00, said method comprising:
   (a) providing a carrier tape having an upper surface and a plurality of cavities separately disposed in said upper surface along a length thereof, each of said cavities including a base that is sized to operably receive and support said product, said base having a base surface area and a surface profile defining an elevated first surface contact area that is less than about 50% of said base surface area;
   (b) positioning said product in said cavity such that said base contact portion of said product is in contact only with said contact surface area of said base; and
   (c) securing a cover tape to said upper surface of said carrier tape, said cover tape including a first side removably securable to said upper surface of said carrier tape, said first side having a contact portion contactable with said product and having a surface texture including embossments defining a delineated second contact surface area that is less than about 50% of said contact portion of said cover tape.

21. A method as in claim 20, including an aperture disposed in selected ones of said cavities.

22. A method as in claim 21, including removing said product from said cavity by applying a force to said product through said aperture.

23. A method as in claim 22 wherein said force is generated by a moving air stream.

24. A method as in claim 22 wherein said force is applied through an actuatable pin.

* * * * *